United States Patent [19]

Hamby, Jr. et al.

[11] 3,956,077

[45] May 11, 1976

[54] METHODS OF PROVIDING CONTACT BETWEEN TWO MEMBERS NORMALLY SEPARABLE BY AN INTERVENING MEMBER

[75] Inventors: John T. Hamby, Jr., Richmond, Va.; Wesley P. Townsend, Princeton Township, Mercer County, N.J.

[73] Assignee: Western Electric Company, Inc., New York, N.Y.

[22] Filed: Mar. 27, 1975

[21] Appl. No.: 562,733

[52] U.S. Cl. ............................... 204/15; 156/209; 204/209
[51] Int. Cl.² .................... C25D 5/02; C25D 7/00
[58] Field of Search ............... 204/15, 28, 206–211; 156/209, 220; 29/625, DIG. 12, 527.4

[56] References Cited
UNITED STATES PATENTS

| | | | |
|---|---|---|---|
| 1,555,975 | 10/1925 | Hubard | 226/53 |
| 2,790,756 | 4/1957 | Cohn | 204/23 |
| 2,851,372 | 9/1958 | Kaplan et al. | 156/220 |
| 2,925,645 | 2/1960 | Bell et al. | 156/220 |
| 2,963,760 | 12/1960 | Cohn | 24/205.16 |
| 3,305,422 | 2/1967 | Hamilton | 156/254 |
| 3,350,250 | 10/1967 | Sanz et al. | 156/150 |
| 3,799,827 | 3/1974 | Takimoto et al. | 156/220 |

*Primary Examiner*—T. M. Tufariello
*Attorney, Agent, or Firm*—J. B. Hoofnagle, Jr.

[57] ABSTRACT

A continuous length, flexible, polymeric substrate has thin layers of copper clad to opposite sides thereof. Patterns of dry photopolymer material are applied to and mask selected portions of the copper to leave exposed other selected portions of the copper. The copper clad substrate is guided by a series of cathodic electrode rollers exterior of a copper plating bath into successive passes through the bath. Portions of the exposed copper contact the electrode rollers and couple the cathodic potential thereof to the bath to effect the plating of copper from the bath onto the exposed selected portions of the copper.

Prior to initial engagement with the cathodic rollers, a series of protrusions are formed in portions of the exposed copper at a height relative to the thickness of the photoresist material sufficient to insure that the copper, by virtue of the protrusions, contacts the electrode rollers to facilitate the plating operation notwithstanding the intervening photoresist material.

10 Claims, 7 Drawing Figures

METHODS OF PROVIDING CONTACT BETWEEN TWO MEMBERS NORMALLY SEPARABLE BY AN INTERVENING MEMBER

BACKGROUND OF THE INVENTION

1. Field of the Invention

This invention relates to methods of providing contact between two members normally separable by an intervening element, and particularly to methods of forming raised surfaces in at least one of the members of sufficient height to extend toward and contact the other member notwithstanding the intervening element therebetween.

2. Description of the Prior Art

In one process for the manufacture of flexible printed circuits, thin layers of copper are initially bonded or clad to opposite major surfaces of a flat, flexible, polymeric substrate of continuous length. Thereafter, a plurality of thin-layered images of a dry photopolymer material are deposited onto spaced portions of the substrate copper in selected patterns to mask some portions of the copper and leave exposed selected portions of the copper which define the patterns of the ultimate conductive paths supported on the flexible substrate. Other portions of the substrate copper adjacent to longitudinal marginal edges of the substrate also remain exposed.

The masked substrate is then passed through a copper electroplating bath to facilitate the plating buildup of copper onto the exposed portions of the thin layers of substrate copper previously bonded to the substrate.

In the electroplating process, a plurality of electrode guide rollers are positioned above the plating bath and cooperate with a corresponding plurality of guide rollers located within the bath to facilitate guiding the masked substrate in undulating, successive passes through the bath. A plurality of plating anodes are positioned within the bath and are connected to the positive side of a plating potential source. The electrode guide rollers are connected to the negative side of the plating potential source.

As the copper clad substrate is passed into contact with the electrode guide rollers during the plating operation, some portions of the exposed substrate copper must make contact with the electrode guide rollers so that the negative side of the plating potential source is coupled, through the substrate copper, to the plating bath to facilitate the plating process. However, even though the image patterns are thin, the intervening presence of the electrically nonconductive, dry photopolymer material generally prevents the exposed substrate copper, including those portions adjacent to the longitudinal marginal edges of the substrate, from making the necessary contact with the electrode guide rollers.

Due to normal tensioning of the substrate as it passes about the electrode guide rollers, portions of the exposed substrate copper adjacent to the longitudinal marginal edges of the substrate occasionally are drawn into contact with the electrode guide rollers. This results in a sporadic plating process. In order to compensate for the sporadic plating, the substrate is moved the plating bath at a slower speed and the plating current is increased. In this manner, some amounts of copper are plated onto the exposed substrate during the plating operation. Ultimately, the required buildup of copper onto the exposed substrate copper is accomplished but at the expense of a slower process speed and higher plating current.

However, as the substrate exits from the bath in the leading stages of the plating operation, small amounts of plating solution are carried from the bath on the exposed substrate copper. Since the intervening photopolymer material is preventing the substrate copper from contacting the electrode guide rollers, the substrate copper is effectively connected, through the bath and the plating anodes, to the positive side of the plating potential source. As successive portions of the substrate copper pass about the cathodic electrode guide rollers, the presence of the small amounts of plating solution between the substrate copper and the electrode guide rollers results undesirably in the plating of copper from the solution onto the electrode guide rollers. However, since the electrode guide rollers are made of stainless steel, and thereby have a passive surface, the copper is loosely plated onto the electrode guide rollers and sometimes appears as a copper-based slurry.

As trailing successive portions of the substrate copper pass over the copper plated, electrode guide rollers, loose bits of the copper which was previously plated onto the rollers transfer to and become embedded in the photopolymer material and the substrate copper. As the substrate is processed in subsequent solder plating, photopolymer-material removal and copper etching procedures to form flexible printed circuits, the embedded bits of copper remain in the developed circuits and form undesirable shorts between adjacent conductive paths of the flexible printed circuits.

Thus, the substrate copper must make contact with the electrode guide rollers to insure that the negative side of the plating potential source is coupled, through the substrate copper, to the plating bath to effect the proper and desired plating of solution copper onto the substrate copper.

SUMMARY OF THE INVENTION

It is, therefore, an object of this invention to provide new and improved methods of providing contact between two members normally separable by an intervening element.

Another object of this invention is to provide new and improved methods of providing contact between the conductive surface of a first member and the conductive surface of a second member notwithstanding the presence of a nonconductive element between the first and second members.

Still another object of this invention is to provide new and improved methods of insuring contact between a moving copper film and an electrode member notwithstanding a plurality of electrically nonconductive, image-masking patterns deposited on the copper film.

A method of providing contact between interfacing surface portions of two members normally separable by an intervening element and embodying certain principles of the invention may include the steps of forming protrusions in the interfacing surface portions of at least one of the two members and moving the two members into proximity with each other with the intervening element therebetween normally preventing contact between the two members, the protrusions being sufficiently formed to provide contact between the two members notwithstanding the presence of the intervening element.

BRIEF DESCRIPTION OF THE DRAWINGS

Other objects and advantages of the present invention will be apparent from the following detailed description when considered in conjunction with the accompanying drawings, in which.

DETAILED DESCRIPTION

During an intermediate portion of one method of manufacturing flexible printed circuits, a flexible article, such as an image-masked, copper-clad, flat, flexible plastic substrate, is processed through a copper plating bath to facilitate the plating of copper onto unmasked portions of copper surfaces clad to the substrate.

Figure 1:
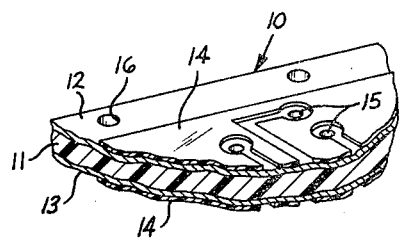
FIG. 1 is a partial sectional perspective view showing a flexible article.

Referring to FIG. 1, there is illustrated a partial sectional view of such a flexible article which is designated generally by the numeral 10. The flexible article 10 includes a flat flexible plastic substrate 11 having thin layers 12 and 13 of copper clad to opposte sides thereof and also includes a plurality of image-masking patterns 14 of masking material deposited onto both layers 12 and 13 of the copper. A plurality of copper plated through-holes 15 are formed in the substrate 11 where copper, which is plated on the walls of the through-holes, electrically connects the layers 12 and 13 of copper. A plurality of spaced registration apertures 16 are formed adjacent to longitudinal marginal edges of and through the flexible article 10 for permitting the alignment of the flexible article during processing thereof.

The flexible substrate 11 is a polymeric material which could be fibre reinforced. Typically, the flexible substrate 11 is about 0.007 inch thick. Each of the thin layers 12 and 13 of copper are typically about 0.0015 inch thick.

The material used to form the image-masking patterns 14 is, for example, a dry film photopolymer material and is typically about 0.002 inch thick. An example of a material which can be used to form the image-masking patterns 14 is that available under the trademark "Riston" from E. I. du Pont de Nemours and Company of Wilmington, Del. While the purpose of the photopolymer material is to mask selected portions of the copper during an electroplating process, it is important to note here that the photopolymer material is electrically nonconductive.

Figure 2:
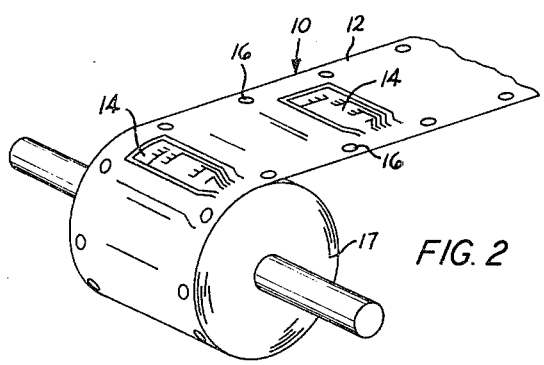
FIG. 2 is a perspective view showing a continuous length of the flexible article of FIG. 1 on a roll.

As illustrated in FIG. 2, the flexible article 10 is formed in a continuous length and is rolled onto a supply roll 17 to serve as a supply for a subsequent copper plating operation. Also, the spaced arrangement of the plurality of the image-masking patterns 14 are clearly illustrated on the layer 12 of copper and appear in a similar arrangement on the layer 13 of copper.

Figure 3:
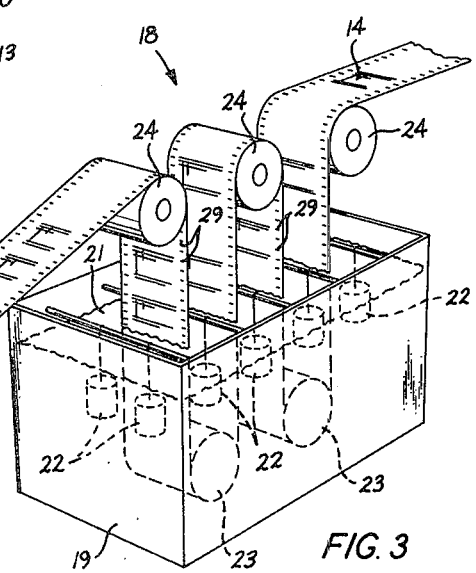
FIG. 3 is a perspective view showing the continuous length, flexible article being moved through an electroplating facility and being processed in accordance with certain principles of the invention.

Referring to FIG. 3, there is illustrated an electroplating facility, designated generally by the numeral 18, which includes a plating tank 19 containing a copper plating bath 21 which is an acid copper sulphate plating solution. A plurality of copper plating anodes 22 are suspended from the tank 19 and are located within the plating bath 21. A plurality of guide rollers 23 are positioned within the plating tank 19 and the plating bath 21 and are aligned substantially in a horizontal row. A plurality of electrode guide rollers 24 are positioned above the plating tank 19 and are also aligned substantially in a horizontal row. The electrode guide rollers 24 are composed of an electrically conductive metal such as, for example, stainless steel. Of course, only the periphery of each of the rollers 24 need be electrically conductive as will be apparent hereinafter.

In a copper electroplating operation, the supply roll 17 of the continuous length, flexible article 10 is positioned adjacent to the electroplating facility 18. Successive portions of the continuous length, flexible article 10 are drawn from the supply roll 17 and passed into guiding engagement with the guide rollers 23 and 24 so that the article is moved in an undulating fashion as illustrated in FIG. 3. The undulting movement of the flexible article 10 permits the drawn successive portions thereof to make several passes through the plating bath 21 as the successive portions approach, contact and move away from each of the guide rollers 23.

It is necessary to apply an electrical potential to the plating bath 21 to effect the electroplating operation. Thus, the plating anodes 22 are connected directly to the positive side of an electroplating potential source (not shown) to facilitate the coupling of one side of the electrical potential to the plating bath 21. Conductive portions of each of the electrode guide rollers 24, including the periphery, are connected directly to the negative side of the power source. In order that the negative side of the electroplating potential source be electrically coupled to the plating bath 21 to facilitate the electroplating operation, the layer 13 of copper, which is on the underside of the flexible article 10, must engage the conductive periphery of the electrode guide rollers 24. Thus, as successive portions of the layer 13 of copper passes through the plating bath 21, the negative side of the potential source is coupled through the electrode guide rollers 24 and the copper of the layer 13 to the plating bath to facilitate the electroplating operation. By virtue of the copper plating of the throughholes 15, the negative side of the potential source is also coupled to the copper of the layer 12 to further facilitate the electroplating operation.

It becomes apparent, then, that it is significant that the layer 13 of copper electrically contact the electrode guide rollers 24 in order for the electroplating operation to be effected.

Figure 5:
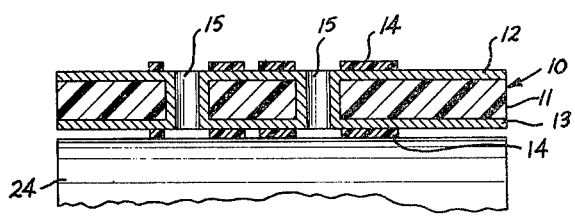
FIG. 5 is a partial sectional view showing the flexible article of FIG. 1 and a guide roller.

As illustrated in FIG. 5, when the flexible article 10 passes into engagement with the electrode guide rollers 24, the image-masking patterns 14 are of such a thickness that the layer 13 of copper generally is precluded from making continuous contact with the electrode guide rollers. Therefore, the negative side of the electroplating potential source is, at best, sporadically coupled to the plating bath 21 and any resulting electroplating operation is sporadic. Such sporadic plating is accomplished when, occasionally, the areas of the layer 13 of copper adjacent to the longitudinal marginal edges of the flexible article 10 are, by chance, urged into brief contact with the electrode guide rollers 24. During these brief periods, copper from the plating bath 21 is sporadically plated onto the layers 12 and 13 of copper. In order to compensate for the sporadic plating, the substrate 10 is moved at a slower speed and the plating current is increased. Gradual plating of copper in this manner ultimately provides the required level of plated copper on the layers 12 and 13.

However, as noted before, the presence of the intervening image-masking patterns 14 generally prevents the layer 13 of copper from engaging the electrode guide rollers 24. During those periods when the layer 13 of copper is not engaging the electrode guide rollers 24, small amounts of plating solution from the plating bath 21 are captured in the spaces between the various sections of the image-masking patterns 14 and are carried to the next successive electrode guide roller 24 external of the plating bath. Since the layer 13 of the copper generally is prevented from contacting the electrode guide rollers 24 by the image-masking patterns 14, the section of the layer 13 of copper, extending between the plating bath 21 and the particular electrode guide roller, is effectively coupled to the positive side of the power source through the plating anodes 22 and the plating bath 21. Since the electrode guide rollers 24 are connected to the negative side of the power source, an electroplating process occurs wherein copper, contained within that portion of the solution of the bath which has been carried by the flexible article 10 to the particular electrode guide roller, is plated onto the electrode guide roller.

The electrode guide rollers 24 are made from stainless steel which has a passive surface. Therefore, the copper which is plated onto the electrode guide rollers is loosely held thereto and, in some instances, appears as a fine copper slurry.

As successive trailing portions of the flexible article 10 pass over the electrode guide rollers 24 having copper undesirably and loosely plated thereon, bits and pieces of the loosely plated copper transfer from the electrode guide rollers and become imbedded in the flexible article 10.

As noted before, successive portions of the flexible article 10 make several passes through the plating bath 21 at a slower speed and increased plating current. By occasional contact between the layer 13 of copper and the electrode guide rollers 24, copper begins to sporadically build up on the layers 12 and 13. The sporadic build up of copper on the layers 12 and 13 ultimately reaches the required level. However, due to the loose particles of copper which have become imbedded in the flexible article 10 by virtue of the deleterious loose plating of copper onto the electrode guide rollers, the ultimate flexible printed circuits manufactured in such a process retain the imbedded copper particles. Such imbedded copper particles ultimately result in undesirable bridging shorts between adjacent circuit paths of the manufactured flexible printed circuits. This renders the flexible printed circuits useless.

Figure 4:
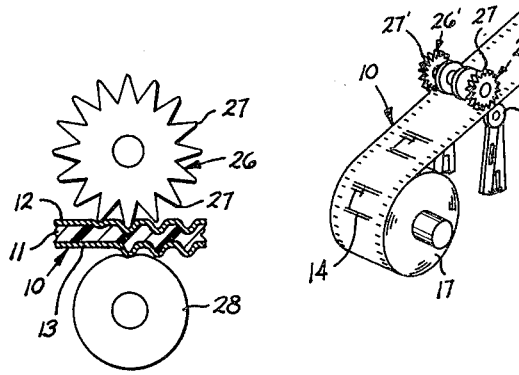
FIG. 4 is a partial view showing the flexible article of FIG. 1 being processed between a protrusion forming roller and a back-up roller in accordance with certain principles of the invention.
Figure 6:
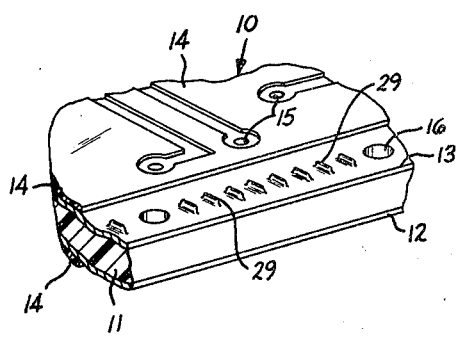
FIG. 6 is a partial sectional perspective view showing the flexible article of FIG. 1 with protrusions formed therein in accordance with certain principles of the invention.

As illustrated in FIGS. 3 and 4, a roller, designated generally by the numeral 26 and having radially-directed protrusion-forming teeth 27, is positioned above a back-up roller 28. Both rollers 26 and 28 are mounted for rotation and are positioned to permit successive portions of the flexible article 10 to be passed therebetween prior to the entry of the successive portions into the electroplating facility 18. As the successive portions of the flexible article 10 are passed between the roller 26 and the back-up roller 28, the teeth 27 engage and dimple spaced portions of the layer 12 of copper to form a series of protrusions 29 in the surface of the layer 13 of copper. The protrusions 29 are spaced from one another in a row adjacent to one longitudinal marginal edge of the flexible article 10 as illustrated in FIG. 6. The back-up roller 28 may be composed of a resilient substance, or it may be composed of a hard substance with the roller mounted in a spring-biased facility, to provide a resilient back up for the roller 26.

Figure 7:
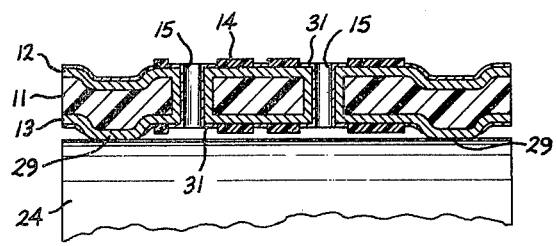
FIG. 7 is a partial sectional perspective view showing the flexible article of FIG. 1 formed with the protrusions of FIG. 6 and in engagement with a roller.

As illustrated in FIG. 7, the protrusions 29 can be formed in rows adjacent to both longitudinal marginal edges of the flexible article 10. The second row of protrusions 29 can be formed by another roller 26° (FIG. 3) having radially-directed protrusion-forming teeth 27' (FIG. 3) and a cooperating back-up roller (not shown).

As the flexible article 10 moves into position to engage the electrode guide rollers 24, the protrusions 29 formed in the layer 13 of copper are of sufficient distance from the outer surface of the layer to provide contact between the layer 13 of copper and the electrode guide rollers 24 notwithstanding the intervening presence of the image-masking patterns 14. This permits the instant coupling of the negative side of the plating potential source from the electrode guide rollers 24 through the layers 12 and 13 of copper to the plating bath 19 to thereby facilitate the plating of copper 31 onto the layers 12 and 13.

Although the flexible article 10, as illustrated in FIG. 7, includes two rows of protrusions 29 formed along opposite longitudinal marginal edges thereof, one row of such protrusions can provide sufficient contact between the layer 13 of copper and the electrode guide rollers 24 to facilitate the electroplating operation. The protrusions 29 are illustrated as extending a greater distance from the outer surface of the layer 13 of copper than the image-masking patterns 14 extend therefrom. However, the protrusions 29 could be formed to extend from the outer surface of the layer 13 of copper a distance sufficient to permit engagement of the protrusions with the electrode guide rollers 24 when the flexible article 10 is tensioned sufficiently to urge the longitudinal marginal edges of the article toward the electrode guide rollers and thereby permit the protrusions to be positioned sufficiently to contact the electrode guide rollers even though the height of the protrusions is less than the thickness of the image-masking patterns.

Additionally, while the illustrated flexible article 10 has layers 12 and 13 of copper on opposite sides of the substrate 11, the inventive principle of insuring contact between a conductive film and a spaced conductive member, such as the electrode guide rollers 24, could be practiced on an article having a layer of copper only on one side of a substrate. For example, if the substrate 11 only had the layer 13 of copper thereon, the protrusions 29 could be formed in the layer in the same manner as described above without departing from the spirit and scope of the invention.

Thus, the material of the image-masking patterns 14 appears as an intervening element between those surface portions of the layer 13 of copper and the electrode guide rollers 24 which it engages. This intervening element normally separates and would thereby preclude contact between other surface portions of the layer 13 of copper and the electrode guide rollers 24 which interface with each other. The protrusions 29 are formed in the interfacing surface portions of the layer 13 of copper at a height sufficient to permit the layer to contact the electrode guide rollers 24 notwithstanding the presence of the intervening element in the form of the image-masking patterns 14. This process then permits the proper plating of copper onto the layers 12 and 13 of copper at all stages of the electroplating operation and eliminates the plating of copper onto the electrode guide rollers 24 and the deleterious results in the flexible printed circuits manufactured thereby.

What is claimed is:

1. A method of providing contact between two members having interfacing surface portions normally separable by an intervening element located between other surface portions of the two members, which comprises the steps of:
   forming protrusions in the interfacing surface portions of at least one of the two members to a height sufficient to permit the protrusions to contact the interfacing surface portions of the other of the two members notwithstanding the presence of the intervening element between other surface portions of the two members, and
   moving the two members proximate to each other, separated by the intervening element, to permit the protrusions formed in the one member to contact the interfacing surface portions of the other member.

2. A method of providing contact between two members as set forth in claim 1 wherein the protrusions are formed in the one member by passing at least a portion of the one member into engagement with protrusion forming elements to thereby form the protrusions therein.

3. A method of providing contact between a longitudinal first electrically conductive member and a second electrically conductive member wherein the first conductive member has successive surface portions which interface with surface portions of the second conductive member and where the interfacing surface portions of the first and second conductive members are normally separated by an intervening nonconductive element located between other surface portions of the first and second conductive members, which comprises the steps of:
   forming protrusions in the successive interfacing surface portions of the longitudinal first conductive member to a height sufficient to permit the protrusions to contact the interfacing surface portions of the second conductive member notwithstanding the presence of the intervening nonconductive element between the first and second conductive members, and
   moving the successive portions of the longitudinal first conductive member proximate the second conductive member with the members being separated by the intervening nonconductive element, the protrusions formed in the successive interfacing surface portions of the longitudinal first conductive member contacting the interfacing surface portions of the second conductive member to thereby provide contact between the first and second conductive members.

4. A method of providing contact between a longitudinal first conductive member and a second conductive member as set forth in claim 3 wherein the protrusions are formed in the first conductive member by passing at least the successive interfacing surface portions of the first conductive member between one element, having a plurality of protrusion forming members, and a resilient element such that the protrusion forming members engage the successive interfacing surface portions and form the protrusions therein.

5. A method of providing contact between a longitudinal first conductive member and a second conductive member as set forth in claim 3 wherein the protrusions are formed in the first conductive member by passing at least the successive interfacing surface portions of the first conductive member between a rotatable element having teeth projecting radially therefrom and a rotatable resilient member so that successive teeth of the rotatable element engage and form the protrusions in the successive interfacing surface portions.

6. A method of providing contact between a longitudinal first electrically conductive member and a second electrically conductive member to facilitate the electrical connecting of the second conductive member to a body spaced therefrom wherein the first conductive member has successive surface portions which interface with surface portions of the second conductive member and where the interfacing surface portions of the first and second conductive members are normally separated by an intervening nonconductive element located between other surface portions of the first and second conductive members, which comprises the steps of:
   forming protrusions in the successive interfacing surface portions of the longitudinal first conductive member to a height sufficient to permit the protrusions to contact the interfacing surface portions of the second conductive member notwithstanding the presence of the intervening nonconductive element between the first and second conductive members,
   moving the successive portions of the longitudinal first conductive member proximate to the second conductive member with the members being separated by the intervening nonconductive element, the protrusions formed in the successive interfacing surface portions of the longitudinal first conductive member contacting the interfacing surface portions of the second conductive member to thereby provide contact between the first and second conductive members, and
   moving the successive portions of the longitudinal first conductive member into contact with the body spaced from the second conductive member with longitudinal sections of the first conductive member extending between the second conductive member and the body spaced therefrom so that, as the protrusions of the first conductive member contact the second conductive member, longitudinally spaced portions of the first conductive member contact the body to provide electrical connection between the second conductive member and the body through the protrusions and longitudinal sections of the first conductive member.

7. A method of providing contact between a longitudinal first conductive member and a second conductive member as set forth in claim 6 wherein the protrusions are formed in the first conductive member by passing at least the successive interfacing surface portions of the first conductive member between one element, having a plurality of protrusion forming members, and a resilient element such that the protrusion forming members engage the successive interfacing surface portions of the first conductive and form the protrusions.

8. A method of providing contact between a longitudinal first conductive member and a second conductive member as set forth in claim 7 wherein the body is an electroplating bath having a first side of an electroplating potential source connected thereto, and which further comprises the step of connecting a second side of the electroplating potential source to the second conductive member so that the second side is coupled from the second conductive member to the electroplating bath through the protrusions and longitudinal sections of the first conductive member to facilitate an electroplating operation.

9. A method of providing contact between a longitudinal first electrically conductive member and a second electrically conductive member to facilitate the electrical connecting of the second conductive member to an electroplating bath to thereby facilitate the electroplating of a metal in the bath onto the first conductive member wherein the first conductive member has successive surface portions which interface with surface portions of the second conductive member and where the interfacing surface portions of the first and second conductive members are normally separated by an intervening nonconductive element located between other surface portions of the first and second conductive members, which comprises the steps of:

moving successive sections of the longitudinal first conductive member into a position whereat protrusions can be formed in successive interfacing surface portions of the first conductive member, forming protrusions in the successive interfacing surface portions of the longitudinal first conductive member to a height sufficient to permit the protrusions to contact the interfacing surface portions of the second conductive member notwithstanding the presence of the intervening nonconductive element between the first and second conductive members, moving the successive portions of the longitudinal first conductive member proximate to the second conductive member with the members being separated by the intervening nonconductive element, the protrusions formed in the successive interfacing surface portions of the longitudinal first conductive member contacting the interfacing surface portions of the second conductive member to thereby provide contact between the first and second conductive members, connecting a first of two sides of an electroplating potential source to the electroplating bath, connecting a second of the two sides of the electroplating potential source to the second conductive member, and moving the successive portions of the longitudinal first conductive member into the electroplating bath with longitudinal sections of the first conductive member extending between the second conductive member and the electroplating bath so that the second of the two sides of the electroplating potential source is coupled from the second conductive member to the electroplating bath through the protrusions and longitudinal sections of the first conductive member to facilitate the electroplating of metal in the bath onto surfaces of the first conductive member within the bath.

10. A method of providing contact between a longitudinal first conductive member and a second conductive member as set forth in claim 9 wherein the protrusions are formed in the first conductive member by passing at least the successive interfacing surface portions of the first conductive member between one element, having a plurality of protrusion forming members, and a resilient element such that the protrusion forming members engage the successive interfacing surface portions of the first conductive member and form the protrusions.

* * * * *